(12) United States Patent
Riley

(10) Patent No.: US 9,508,414 B2
(45) Date of Patent: Nov. 29, 2016

(54) MEMORY CELL SUPPLY VOLTAGE REDUCTION PRIOR TO WRITE CYCLE

(71) Applicant: Advanced Micro Devices, Inc., Sunnyvale, CA (US)

(72) Inventor: John R. Riley, Spicewood, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 239 days.

(21) Appl. No.: 13/874,725

(22) Filed: May 1, 2013

(65) Prior Publication Data

US 2014/0328112 A1 Nov. 6, 2014

(51) Int. Cl.
*G11C 11/00* (2006.01)
*G11C 11/24* (2006.01)

(52) U.S. Cl.
CPC ..................................... *G11C 11/24* (2013.01)

(58) Field of Classification Search
CPC ....... G11C 11/24; G11C 11/413; G11C 7/00; G11C 5/14
USPC ....... 365/49.1, 49.11, 154, 189.16, 226, 227, 365/228
See application file for complete search history.

(56) References Cited

U.S. PATENT DOCUMENTS

| | | | |
|---|---|---|---|
| 5,715,191 A * | 2/1998 | Yamauchi | G11C 11/412 365/154 |
| 6,341,098 B2 * | 1/2002 | Yamagata | 365/226 |
| 7,684,230 B2 * | 3/2010 | Yamagami et al. | 365/154 |
| 2003/0099145 A1 * | 5/2003 | Clark | G11C 5/147 365/226 |
| 2010/0188920 A1 * | 7/2010 | Futatsuyama et al. | 365/226 |
| 2014/0063916 A1 * | 3/2014 | Freiburger | G11C 11/00 365/154 |

\* cited by examiner

*Primary Examiner* — Tha-O H Bui

(57) ABSTRACT

An integrated circuit device includes a memory cell coupled to a supply voltage line to receive a supply voltage and a voltage control circuit operable to reduce a magnitude of the supply voltage prior to a write cycle to the memory cell. The voltage control circuit includes a first capacitor that is selectively coupled between a supply voltage line and a first reference supply voltage line of the integrated circuit device in anticipation of a write cycle to the memory cell.

17 Claims, 3 Drawing Sheets

MEMORY CELL SUPPLY VOLTAGE REDUCTION PRIOR TO WRITE CYCLE

FIELD OF THE DISCLOSURE

The present disclosure relates generally to memory devices and more particularly to managing voltage for the memory devices.

BACKGROUND

In a memory device, such as static random access memory (SRAM) cell, an electrical charge (HIGH) is stored in the memory device to represent a digital "1", while the absence of such an electrical charge or a relatively low charge (LOW) stored in the device indicates a digital "0". To increase the ability to write to the memory cell, the power supply voltage for the cell may be reduced during the write cycle. Reducing the power supply voltage for the write cycle is commonly referred to as initiating a VDD collapse.

One technique for implementing bit-cell VDD collapse during a write cycle is to use a pull-down transistor enabled by a write assist signal. Clamping transistors that are coupled between the memory cell supply voltage line and the main power supply voltage maintain VDD at its normal level during normal operations. When the pull-down transistor is enabled prior to a write cycle, the pull-down transistor is in contention with the clamping transistors, but since it is stronger than the clamping transistors, VDD drops.

This scheme creates a large crow-bar current between pull-down and clamp due to the contention-based design. Process Variation (PV) and Bias Temperature Instability Degradation (BTI) can significantly shift up or down the magnitude of the VDD collapse. The up/down shift in collapse can cause bit-cells to either lose their state or prevent a successful write. To combat the variation in the collapse circuitry, columns across the memory are typically shorted together to average out the variation. The need to short columns together prevents this approach from being used in a bit-writable memory design without upsizing the devices to reduce variation, resulting in a significant area increase.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

FIGS. 1-4 illustrate example techniques for controlling or managing the power supply voltage of a memory cell during write cycles. A pull-down transistor in line with a ballast capacitor provides a pull-down path for a voltage collapse prior to a write cycle. The net capacitance of the ballast capacitor affects the magnitude of the collapse, thereby reducing the effects of process variation and degradation on the collapse.

Figure 1:
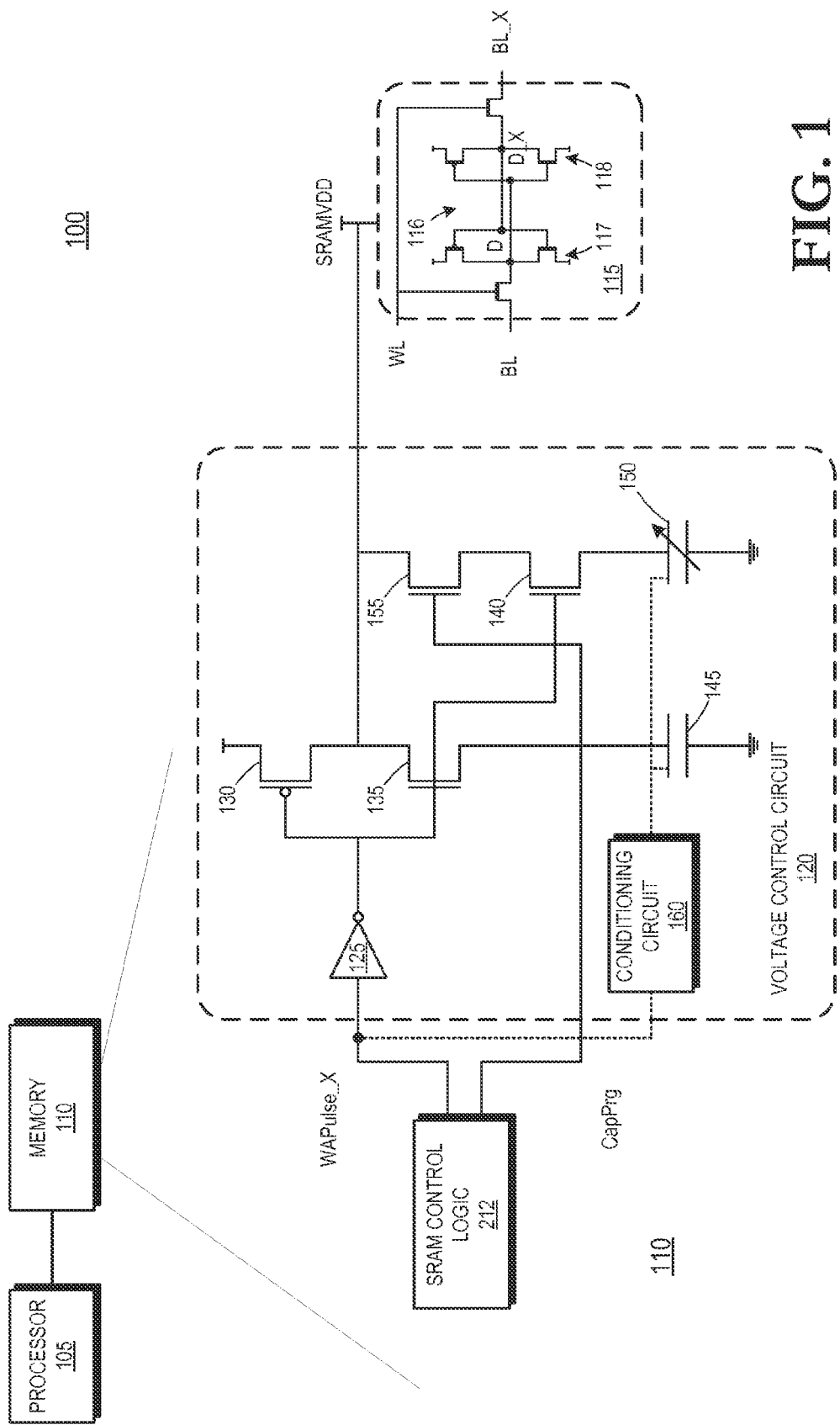
FIG. 1 is a block diagram of a processing system including an example memory cell and a voltage control circuit for generating a power supply voltage for the cell in accordance with some embodiments.

FIG. 1 illustrates a processing system 100 in accordance with some embodiments. The processing system 100 can be used in any of a variety of electronic devices, such as a personal computer, server, portable electronic device such as a cellular phone or smartphone, a game system, set-top box, and the like. The processing system 100 generally stores and executes instructions organized as computer programs in order to carry out tasks defined by the computer programs, such as data processing, communication with other electronic devices via a network, multimedia playback and recording, execution of computer applications, and the like.

The processing system 100 includes a plurality of integrated circuits including a processor 105 and a memory 110. The memory 110 may represent one or more levels in the memory hierarchy of the processing system 100. The memory 110 is generally configured both to store the instructions to be executed by the processor 105 in the form of computer programs and to store the data that is manipulated by the executing instructions. The processing system 100 implements one or more memory arrays using SRAM memory. For example, the memory 110 represent an SRAM cache memory on the same die as the processor 105 or external to the processor 105.

FIG. 1 illustrates an example memory cell 115 (i.e., SRAM cell) and a voltage control circuit 120 for generating a power supply voltage, SRAMVDD, for the memory cell 115 in accordance with some embodiments. An actual memory array will have many memory cells 115, but for ease of illustration, the concepts are described in the context of a single memory cell 115. The voltage control circuit 120 may be associated with a subset of a memory array for which a write is being implemented. For example, an array may be divided into a plurality of portions, where the writes for the various portions are controlled separately. The particular distribution of the voltage control circuit 120 may vary depending on the particular architecture. In a memory array that enables a single row or column for writing to a memory cell, each row or column may have its own voltage control circuit 120.

The memory cell 115 includes a storage element 116 including cross coupled inverters 117, 118. A wordline, denoted "WL", is used to enable select transistors to connect bit lines, denoted "BL" and "BL_X", to the storage element 116, which stores the data value, denoted "D" and its compliment, denoted "D_X", in the memory cell 115.

The voltage control circuit 120 operates to drop the power supply voltage, SRAMVDD, to the memory cell 115 prior to a write to increase the write margin of the memory cell 115. The voltage drop is commonly referred to as a voltage collapse. The voltage control circuit 120 includes a buffer 125 that receives a write assist pulse signal, denoted "WAPulse_X" from SRAM control logic 212, to trigger the SRAMVDD collapse event. The buffer 125 is coupled to a pull-up transistor 130 and pull-down transistors 135, 140. The pull-down transistor 135 is coupled to a ballast capacitor 145, and the pull-down transistor 140 is coupled to a variable ballast capacitor 150. An enable transistor 155 is coupled in the path of the pull-down transistor 140 and the variable ballast capacitor 150. A conditioning circuit 160 is coupled to the ballast capacitors 145, 150. Although the present subject matter illustrated VDD collapse for an SRAM cell, the techniques may be applied to other types of memory cells, where it is advantageous to reduce the supply voltage prior to a write cycle.

During normal cell operation (i.e., no read or write, and WAPulse_X de-asserted high), SRAMVDD is held high by the pull-up transistor 130. The pull-down transistors 135, 140 are activated by the WAPulse_X signal to initiate the SRAMVDD collapse. The pull-down transistors 135, 140 pull down the SRAMVDD voltage through the ballast capacitor 145 and the variable ballast capacitor 150, respectively. Because the pull-up transistor 130 is disabled by the WAPulse_X signal, there is no contention situation created during the voltage collapse. The enable transistor 155 is responsive to a control signal, denoted "CapPrg", from the SRAM control logic 212 to selectively connect the pull-down transistor 140 and the variable ballast capacitor 150 to the SRAMVDD line. The ballast capacitors 145, 150 are referenced to the low reference supply voltage for the device, VSS (e.g., ground) by the conditioning circuit 160. The conditioning circuit 160 discharges the ballast capacitors 145, 150 between write cycles. For example, the conditioning circuit 160 may monitor the WAPulse_X signal and enable a resistive path to ground to discharge the ballast capacitors 145, 150 after the WAPulse_X signal is de-asserted.

Although the programmable ballast capacitor 150 is illustrated as being a single capacitor enabled by a single transistor 155, multiple ballast capacitors 150 and associated transistors 155 may be implemented, and the net capacitance of the variable ballast capacitor 150 may be configured by selectively enabling a subset of the available capacitors 150 to enable using a corresponding subset of a plurality of enable transistors 155. Hence, the variable ballast capacitor 150 in such an implementation would be variable in the sense that the number of capacitors in the subset may be selected to set the net capacitance of the variable ballast capacitor 150. In some embodiments, the SRAM control logic 212 may generate a plurality of write assist pulses for controlling multiple pull-up/pulldown transistor pairs 130, 135 and associated ballast capacitors 145, and the net capacitance may be determined by the number of write assist pulses sent. In such embodiments, the transistors 155, 140, and the variable ballast capacitor 150 may be omitted. The magnitude of the voltage collapse may be tuned by programming the size of the variable ballast capacitor 150. Such programming may be implemented in some embodiments using fusible links, a register for storing a tuning value, or by dynamic tuning.

In some embodiments, the ballast capacitors 145, 150 may be implemented using existing capacitors in the processing system 100 that may have other purposes, but are unused during write cycles. For example, idle segmented bit-lines, the opposite half of an array VSS bit-cell node, a transistor configured to act as a capacitor, or some other idle capacitive metal, may be used to implement the ballast capacitors, mitigating the need for additional die area.

Figure 2:
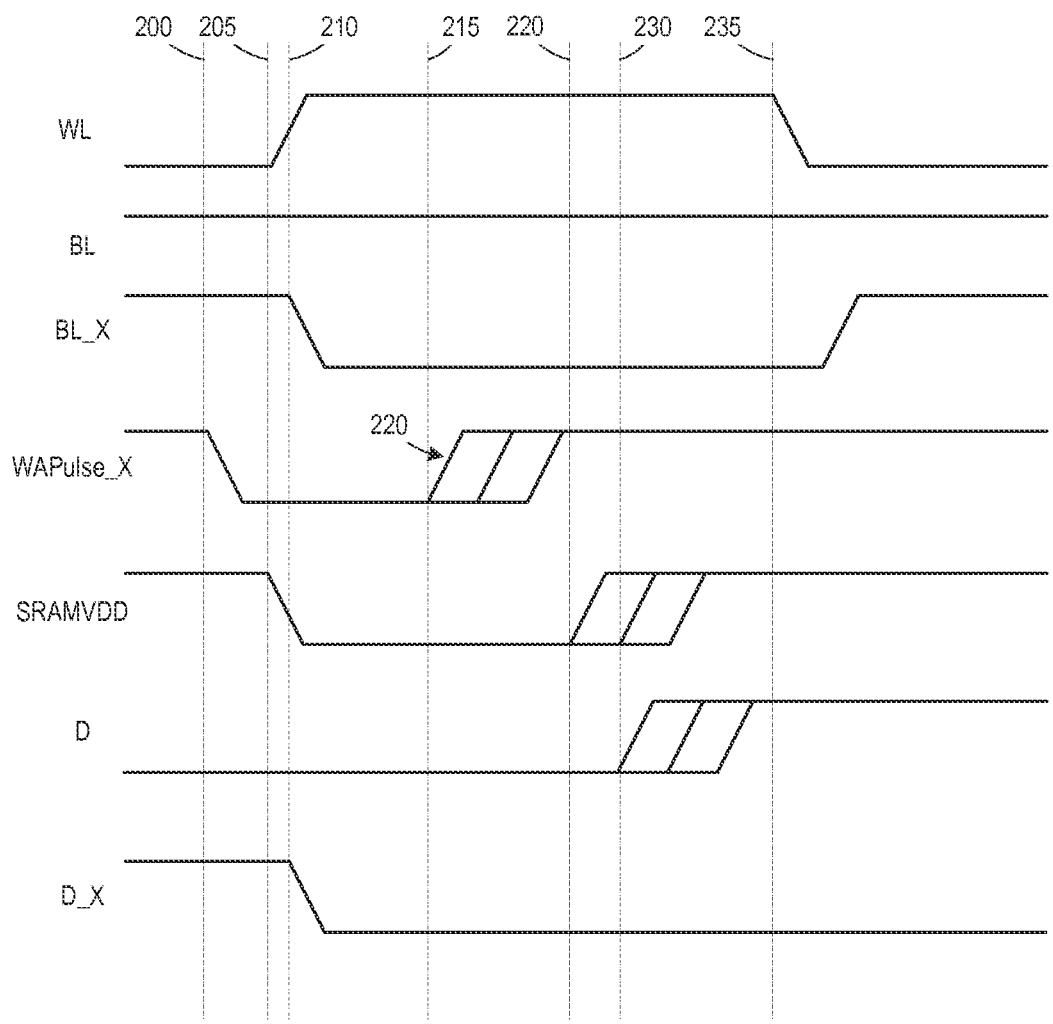
FIG. 2 is a timing diagram illustrating the operation of the voltage control circuit of FIG. 2 during a write cycle in accordance with some embodiments.
Figure 3:
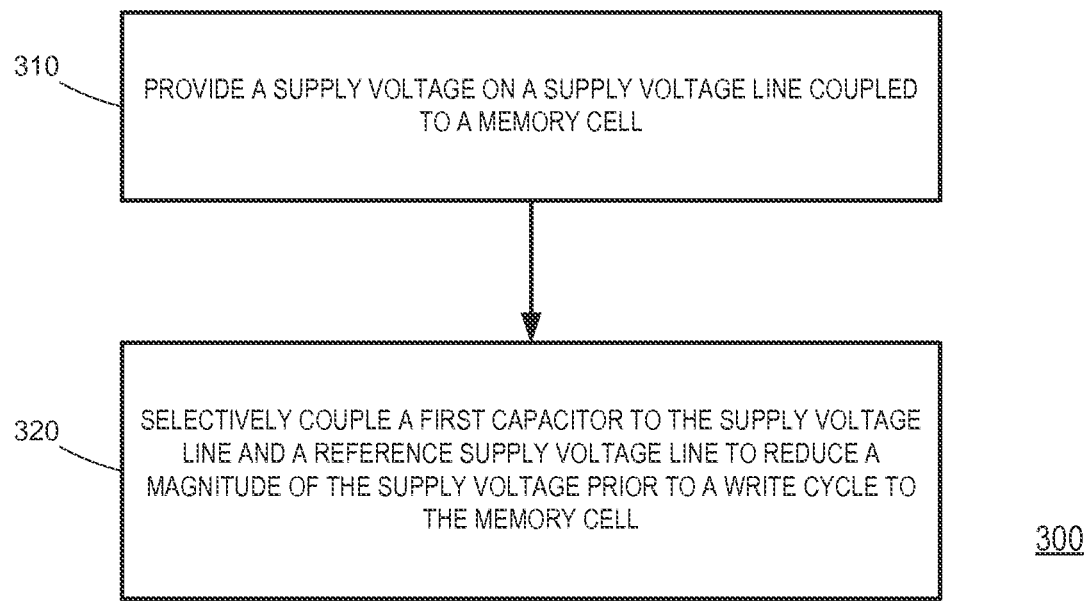
FIG. 3 is a simplified flow diagram of a method for initiating VDD collapse in accordance with some embodiments.

FIG. 2 is a timing diagram illustrating the operation of the voltage control circuit 120 of FIG. 1 during a write cycle in accordance with some embodiments. In the example of FIG. 3, a logic "1" is bring written into the memory cell 115. At event 200, the WAPulse_X signal is asserted low to initiate the SRAMVDD collapse. At event 205, the value of SRAM-VDD reduces in magnitude to a level depending on the tuning of the voltage control circuit 120. At event 205, the wordline, WL, signal is asserted for the cell 115, and at event 210, the BL_X signal is set to a logic "0" to write a "0" into the D_X storage node of the cell 115. The BL signal is held at a logic "1."

At event 215, the WAPulse_X signal is de-asserted high to restore the SRAMVDD voltage. The WAPulse_X signal may include a programmable time interval, represented by edges 220. Following de-assertion of the WAPulse_X signal, the SRAMVDD voltage is restored at event 225. Following restoration of the SRAMVDD voltage for the cell 115, the D storage node of the cell 115 registers the logic "1" at event 330. The timing of the SRAMVDD recovery and the registration of the D storage node also depend on the timing of the edge 220 selected for the WAPulse_X signal. In event 335, the WL signal is de-asserted to complete the write cycle. To write a logic "0" into the cell, the logic "0" is written into the D storage node using the BL signal.

Tuning the operation of the voltage control circuit 120 may be implemented by selecting a value for the variable ballast capacitor 150 and the timing edge 220 of the WAPulse_X signal. Setting these parameters allows the magnitude and timing of the SRAMVDD collapse to be controlled. For example, the capacitance may be increased to increase the magnitude of the collapse, or vice versa.

The general operation of the voltage control circuit of FIG. 1 is illustrated further in FIG. 3, which is a simplified flow diagram of a method 300 for initiating an SRAMVDD collapse in accordance with some embodiments. In method block 310, a supply voltage is provided on a supply voltage line coupled to a memory cell. In method block 320, a first capacitor is selectively coupled to the supply voltage line and a reference supply voltage line to reduce a magnitude of the supply voltage prior to a write cycle to the memory cell.

In some embodiments, the devices and techniques described above are implemented in a system comprising one or more integrated circuit (IC) devices (also referred to as integrated circuit packages or microchips), such as the processor described above with reference to FIGS. 1-3. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 4:
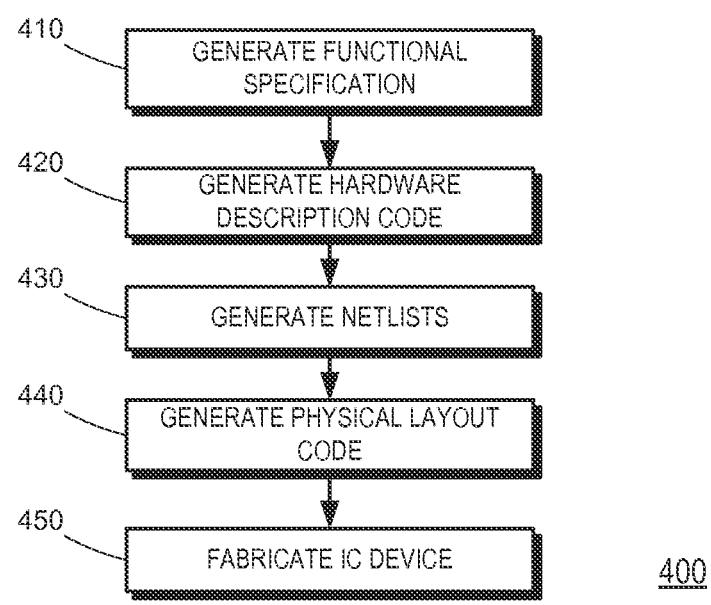
FIG. 4 is a flow diagram illustrating an example method for the design and fabrication of an IC device implementing one or more aspects in accordance with some embodiments.

FIG. 4 is a flow diagram illustrating an example method 400 for the design and fabrication of an IC device implementing one or more aspects in accordance with some embodiments. As noted above, the code generated for each of the following processes is stored or otherwise embodied in computer readable storage media for access and use by the corresponding design tool or fabrication tool.

At block 410 a functional specification for the IC device is generated. The functional specification (often referred to as a micro architecture specification (MAS)) may be represented by any of a variety of programming languages or modeling languages, including C, C++, SystemC, Simulink, or MATLAB.

At block 420, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, a synthesis tool is used to synthesize the hardware description code to generate code representing or defining an initial physical implementation of the circuitry of the IC device at block 430. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 440, one or more EDA tools use the netlists produced at block 430 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist (s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 450, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

The use of the voltage control circuit described herein has numerous advantages. The pull-down transistor in combination with the ballast capacitor(s) provide a pull-down path for a voltage collapse, where the magnitude of the collapse it determined by the net capacitance of the ballast capacitor (s). This approach does not create crowbar currents due to contention. Also, the effects of process variation and degradation on the magnitude of the collapse are reduced.

According to some embodiments, an integrated circuit device includes a memory including at least one memory cell coupled to a supply voltage line to receive a supply voltage and a voltage control circuit operable to reduce a magnitude of the supply voltage prior to a write cycle to the memory cell. The voltage control circuit includes a first pull-down transistor coupled to the supply voltage line and a first ballast capacitor coupled between the first pull-down transistor and a reference supply voltage line of the integrated circuit device.

According to some embodiments, a processor includes a static random access memory including at least one memory cell coupled to a supply voltage line to receive a supply voltage a voltage control circuit operable to reduce a magnitude of the supply voltage prior to a write cycle to the memory cell. The voltage control circuit includes a first pull-down transistor coupled to the supply voltage line and a first ballast capacitor coupled between the first pull-down transistor and a reference supply voltage line of the integrated circuit device.

According to some embodiments, a method includes providing a supply voltage on a supply voltage line coupled to a memory cell. A magnitude of the supply voltage is reduced prior to a write cycle to the memory cell by selectively coupling a first capacitor to the supply voltage line and a reference supply voltage line to reduce a magnitude of the supply voltage.

In some embodiments, certain aspects of the techniques described above may implemented by one or more processors of a processing system executing software. The software comprises one or more sets of executable instructions stored on a computer readable medium that, when executed by the one or more processors, manipulate the one or more processors to perform one or more aspects of the techniques described above. The software is stored or otherwise tangibly embodied on a computer readable storage medium accessible to the processing system, and can include the instructions and certain data utilized during the execution of the instructions to perform the corresponding aspects.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An integrated circuit device, comprising:
   a memory comprising at least one memory cell coupled to a supply voltage line to receive a supply voltage;
   a voltage control circuit to reduce a magnitude of the supply voltage prior to a write cycle to the memory cell, the voltage control circuit comprising:
      a first pull-down transistor having first and second terminals and a first gate terminal, wherein the first terminal is coupled to the supply voltage line; and
      a first capacitor coupled to the second terminal of the first pull-down transistor and a first reference supply voltage line of the integrated circuit device, wherein a reference voltage on the first reference supply voltage line is less than the supply voltage and wherein the first capacitor is the only conductive path between the second terminal of the first pull-down transistor and the first reference supply voltage line; and
   control logic coupled to the first gate terminal of the first pull-down transistor to generate a write assist control signal to enable to the first pull-down transistor to reduce the magnitude of the supply voltage prior to the write cycle.

2. The device of claim 1, wherein the write assist control signal comprises a write assist pulse.

3. The device of claim 2, wherein the first pull-down transistor further comprises a plurality of pull-down transistors coupled to the supply voltage line, the first capacitor further comprises a plurality of capacitors coupled to ones of the plurality of pull-down transistors and the first reference supply voltage line, and the voltage control circuit further comprises control logic to generate a plurality of write assist pulses for selectively enabling ones of the plurality of pull-down transistors.

4. The device of claim 1, wherein the voltage control circuit further comprises:
   a second pull-down transistor having third and fourth terminals and a second gate terminal, wherein the third terminal is coupled to the supply voltage line;
   a second capacitor coupled to the second terminal of the first pull-down transistor and the first reference supply voltage line;
   an enable transistor coupled to the supply voltage line and the first reference supply voltage line in a path of the second capacitor, and
   control logic to selectively enable the enable transistor.

5. The device of claim 1, wherein the first capacitor comprises a variable capacitor, and the magnitude of the supply voltage is reduced to a value based on a capacitance of the variable capacitor.

6. The device of claim 1, wherein the voltage control circuit further comprises a pull-up transistor coupled to a second reference supply voltage line of the integrated circuit device and the supply voltage line.

7. The device of claim 6, further comprising control logic to generate a write assist pulse for enabling the first pull-down transistor and disabling the pull-up transistor prior to the write cycle.

8. The device of claim 1, further comprising a processor, wherein the processor comprises the memory and the voltage control circuit.

9. The device of claim 8, wherein the memory comprises a static random access memory.

10. The device of claim 1, wherein the static random access memory comprises a cache memory.

11. An integrated circuit device comprising,
   a memory comprising at least one memory cell coupled to a supply voltage line to receive a supply voltage;
   a voltage control circuit to reduce a magnitude of the supply voltage prior to a write cycle to the memory cell, the voltage control circuit comprising:
      a first pull-down transistor having first and second terminals and a first gate terminal, wherein the first terminal is coupled to the supply voltage line; and
      a first capacitor coupled to the second terminal of the first pull-down transistor and a first reference supply voltage line of the integrated circuit device, wherein a reference voltage on the first reference supply voltage line is less than the supply voltage;
      control logic coupled to the first gate terminal of the first pull-down transistor to generate a write assist control signal to enable to the first pull-down transistor to reduce the magnitude of the supply voltage prior to the write cycle, and
      a conditioning circuit to discharge the first capacitor following the write cycle.

12. A method, comprising:
   providing a supply voltage on a supply voltage line coupled to a memory cell; and
   asserting a write assist control signal to selectively enable a first pull-down transistor having a first terminal coupled to the supply voltage line and a second terminal coupled to a first capacitor coupled to a first reference supply voltage line having a reference voltage less than the supply voltage to reduce a magnitude of the supply voltage prior to a write cycle to the memory cell; and
   discharging the first capacitor following the write cycle.

13. The method of claim 12, further comprising selectively enabling a second pull-down transistor having a third terminal coupled to the supply voltage line and a fourth terminal coupled to a second capacitor coupled to the first reference supply voltage line prior to the write cycle.

14. The method of claim 13, further comprising selectively enabling an enable transistor coupled to the supply voltage line and the first reference supply voltage line in a path of the second capacitor.

15. The method of claim 13, wherein asserting the write assist control signal to selectively enabling the first and second pull-down transistors comprises generating one or more write assist pulses.

16. The method of claim 12, further comprising configuring a capacitance of the first capacitor to configure a value for the reduction in the supply voltage.

17. The method of claim 12, further comprising disabling a pull-up transistor coupled to a second reference supply voltage line and the supply voltage line prior to the write cycle.

* * * * *